United States Patent
Shenoy et al.

(10) Patent No.: US 12,282,423 B2
(45) Date of Patent: Apr. 22, 2025

(54) DATA STORAGE DEVICE AND METHOD FOR INTELLIGENT BLOCK ALLOCATION

(71) Applicant: Western Digital Technologies, Inc., San Jose, CA (US)

(72) Inventors: Manoj M. Shenoy, Kochi (IN); Lakshmi Sowjanya Sunkavelli, Bangalore (IN); Niranjani Rajagopal, Madurai (IN)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/218,271

(22) Filed: Jul. 5, 2023

(65) Prior Publication Data

US 2025/0013561 A1   Jan. 9, 2025

(51) Int. Cl.
*G06F 12/02*   (2006.01)
*G06F 3/06*   (2006.01)

(52) U.S. Cl.
CPC ........ *G06F 12/0238* (2013.01); *G06F 3/0619* (2013.01); *G06F 3/064* (2013.01); *G06F 3/0679* (2013.01); *G06F 12/0246* (2013.01)

(58) Field of Classification Search
None
See application file for complete search history.

(56) References Cited

U.S. PATENT DOCUMENTS

| | | | |
|---|---|---|---|
| 8,737,136 B2 | 5/2014 | Cometti | |
| 8,874,825 B2 * | 10/2014 | Alrod | G06F 12/0246 365/185.11 |
| 9,141,475 B2 | 9/2015 | Alrod et al. | |
| 9,836,219 B2 | 12/2017 | Kim et al. | |
| 9,846,554 B1 | 12/2017 | Lai et al. | |
| 9,905,302 B2 | 2/2018 | Karakulak et al. | |
| 10,008,278 B1 * | 6/2018 | Shur | G11C 16/3495 |
| 10,871,924 B1 * | 12/2020 | Lin | G06F 3/0659 |
| 10,984,866 B2 | 4/2021 | Oh | |
| 11,551,761 B1 | 1/2023 | Yang et al. | |
| 2007/0016721 A1 * | 1/2007 | Gay | G06F 12/0246 711/170 |
| 2015/0301755 A1 * | 10/2015 | Chodem | G06F 11/1612 714/764 |
| 2016/0092302 A1 * | 3/2016 | Agarwal | G11C 29/52 714/773 |
| 2017/0031612 A1 * | 2/2017 | Ravimohan | G06F 3/065 |
| 2021/0366875 A1 * | 11/2021 | Di | H01L 25/50 |
| 2022/0199156 A1 * | 6/2022 | Sharon | G11C 11/5671 |
| 2022/0404966 A1 * | 12/2022 | Kanno | G06F 3/0631 |

OTHER PUBLICATIONS

Gal et al. "Algorithms and Data Structures for Flash Memories." Jun. 2005. ACM. ACM Computing Surveys. vol. 37. pp. 138-163.*

* cited by examiner

*Primary Examiner* — Nathan Sadler

(74) *Attorney, Agent, or Firm* — Crowell & Moring LLP

(57) ABSTRACT

Some data storage devices select blocks of memory from a free block pool and randomly allocate the blocks as primary and secondary blocks to redundantly store data in a write operation. However, some blocks, such as blocks on the edge of a plane, may not serve well as primary blocks. One example data storage device presented herein addresses this problem by allocating such blocks as secondary blocks instead of primary blocks.

16 Claims, 8 Drawing Sheets

DATA STORAGE DEVICE AND METHOD FOR INTELLIGENT BLOCK ALLOCATION

BACKGROUND

Some data storage devices select blocks of memory from a free block pool and randomly allocate the blocks as primary and secondary blocks to redundantly store data in a write operation. After the data is redundantly written, the data storage device can check to see if the data was successfully written to the primary block. If the data was successfully written to the primary block, the secondary block can be repurposed. However, if the data was not successfully written to the primary block, the data may still be available in the secondary block if successfully written therein.

DETAILED DESCRIPTION

The following embodiments generally relate to a data storage device and method for intelligent block allocation. In one embodiment, a data storage device is provided comprising a memory and a controller coupled with the memory. The controller is configured to: select blocks from a free block pool for use as primary and secondary blocks for a write operation; determine whether one or both of the blocks are plane edge blocks; and in response to determining that only one of the blocks is a plane edge block, allocate that block as the secondary block and allocate the other block as the primary block.

In another embodiment, a method is provided that is performed in a data storage device comprising a memory. The method comprises: identifying block numbers of blocks chosen for use as primary and secondary blocks for a write operation; determining whether one or both of the blocks are in a specified range of block numbers; and performing one of: in response to determining that only one of the blocks is in the specified range of block numbers. allocating that block as the secondary block and allocating the other block as the primary block; in response to determining that both of the blocks are in the specified range of block numbers. randomly allocating one of the blocks as the primary block and the other block as the secondary block; or in response to determining that neither of the blocks is in the specified range of block numbers. randomly allocating one of the blocks as the primary block and the other block as the secondary block.

In yet another embodiment, a data storage device is provided comprising: a memory; means for determining whether one or both blocks identified for use as primary and secondary blocks for a write operation are plane edge blocks; and means for in response to determining that only one of the blocks is a plane edge block, allocating that block as the secondary block and allocating the other block as the primary block.

Other embodiments are possible, and each of the embodiments can be used alone or together in combination. Accordingly, various embodiments will now be described with reference to the attached drawings.

Embodiments

The following embodiments relate to a data storage device (DSD). As used herein, a "data storage device" refers to a device that stores data. Examples of DSDs include, but are not limited to, hard disk drives (HDDs), solid state drives (SSDs), tape drives, hybrid drives, etc. Details of example DSDs are provided below.

Figure 1A:
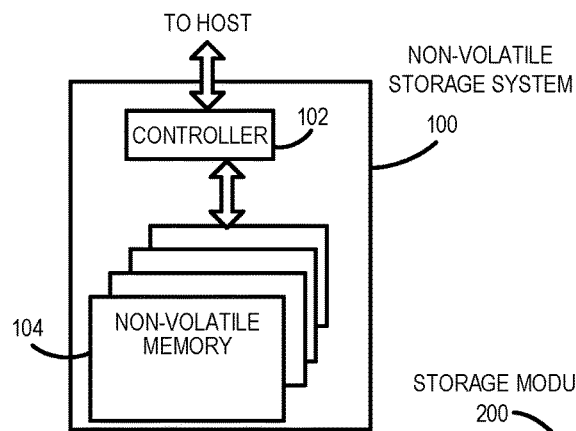
FIG. 1A is a block diagram of a data storage device of an embodiment.
Figure 1B:
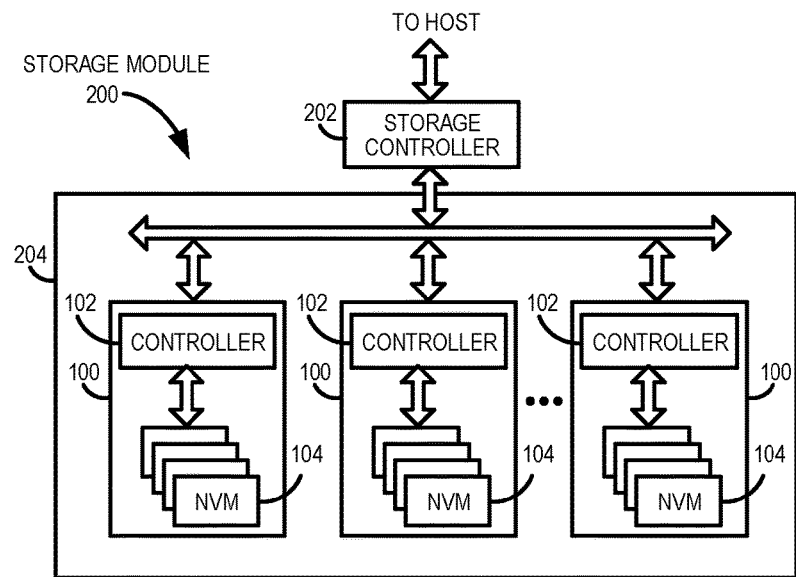
FIG. 1B is a block diagram illustrating a storage module of an embodiment.
Figure 1C:
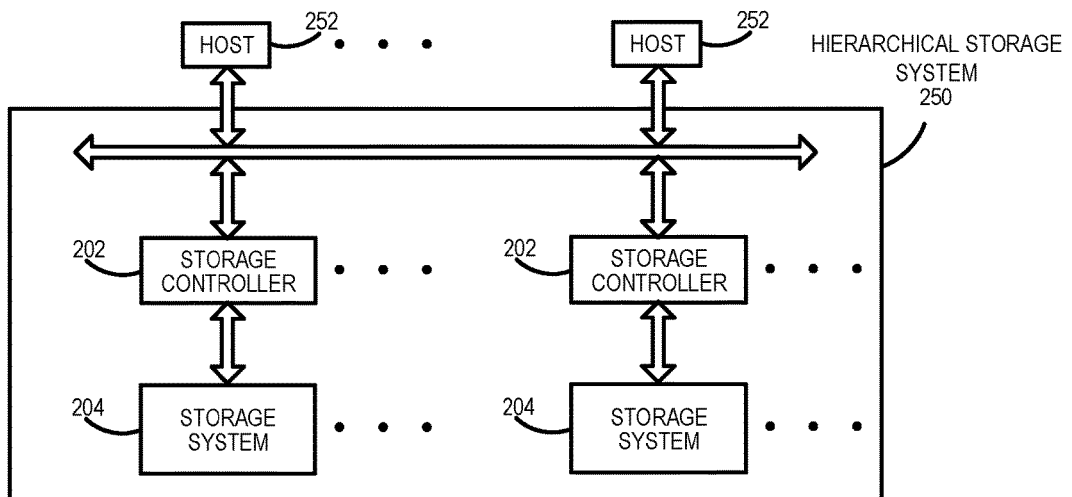
FIG. 1C is a block diagram illustrating a hierarchical storage system of an embodiment.

Data storage devices suitable for use in implementing aspects of these embodiments are shown in FIGS. 1A-1C. FIG. 1A is a block diagram illustrating a data storage device 100 according to an embodiment of the subject matter described herein. Referring to FIG. 1A, data storage device 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC) (e.g., dual-level cells, triple-level cells (TLC), quad-level cells (QLC), etc.) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, the data storage device 100 may be a card based system, such as a secure digital (SD) or a micro secure digital (micro-SD) card. In an alternate embodiment, the data storage device 100 may be part of an embedded data storage device.

Although, in the example illustrated in FIG. 1A, the data storage device 100 (sometimes referred to herein as a storage module) includes a single channel between controller 102 and non-volatile memory die 104, the subject matter described herein is not limited to having a single memory channel. For example, in some architectures (such as the ones shown in FIGS. 1B and 1C), two, four, eight or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile data storage devices 100. As such, storage module 200 may include a storage controller 202 that interfaces with a host and with data storage device 204, which includes a plurality of data storage devices 100. The interface between storage controller 202 and data storage devices 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective data storage device 204. Host systems 252 may access memories within the storage system 250 via a bus interface. In one embodiment, the bus interface may be a Non-Volatile Memory Express (NVMe) or Fibre Channel over Ethernet (FCOE) interface. In one embodiment, the system illustrated in FIG. 1C may be a rack mountable mass storage system that is accessible by multiple host computers, such as would be found in a data center or other location where mass storage is needed.

Figure 2A:
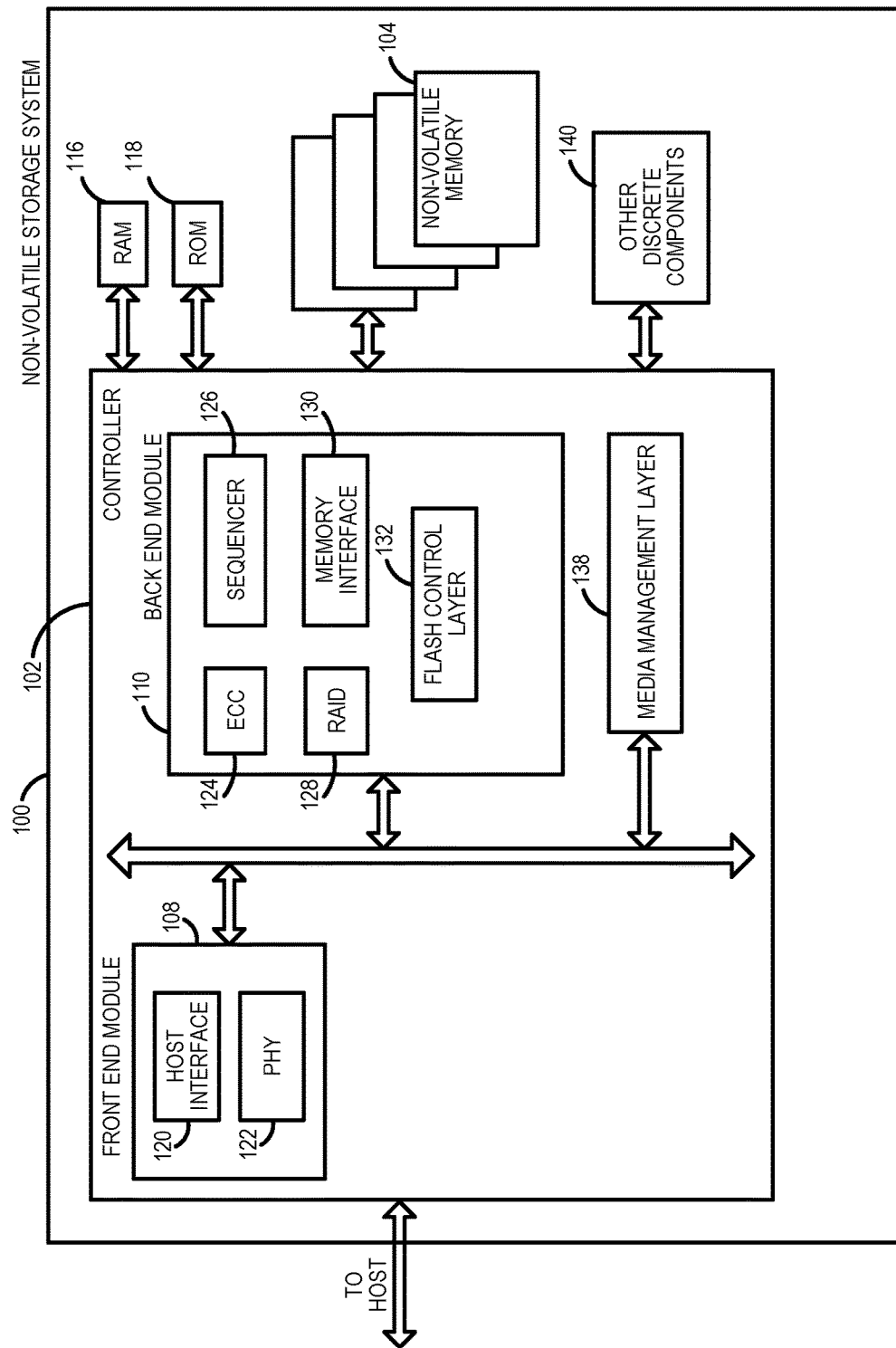
FIG. 2A is a block diagram illustrating components of the controller of the data storage device illustrated in FIG. 1A according to an embodiment.

FIG. 2A is a block diagram illustrating components of controller 102 in more detail. Controller 102 includes a front-end module 108 that interfaces with a host, a back-end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro) processor or processing circuitry that usually performs a particular function of related functions, or a self-contained hardware or software component that interfaces with a larger system, for example. Also, "means" for performing a function can be implemented with at least any of the structure noted herein for the controller and can be pure hardware or a combination of hardware and computer-readable program code.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front-end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back-end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR)

interface, such as a Toggle Mode 200, 400, or 800 interface. A flash control layer 132 controls the overall operation of back-end module 110.

The data storage device 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
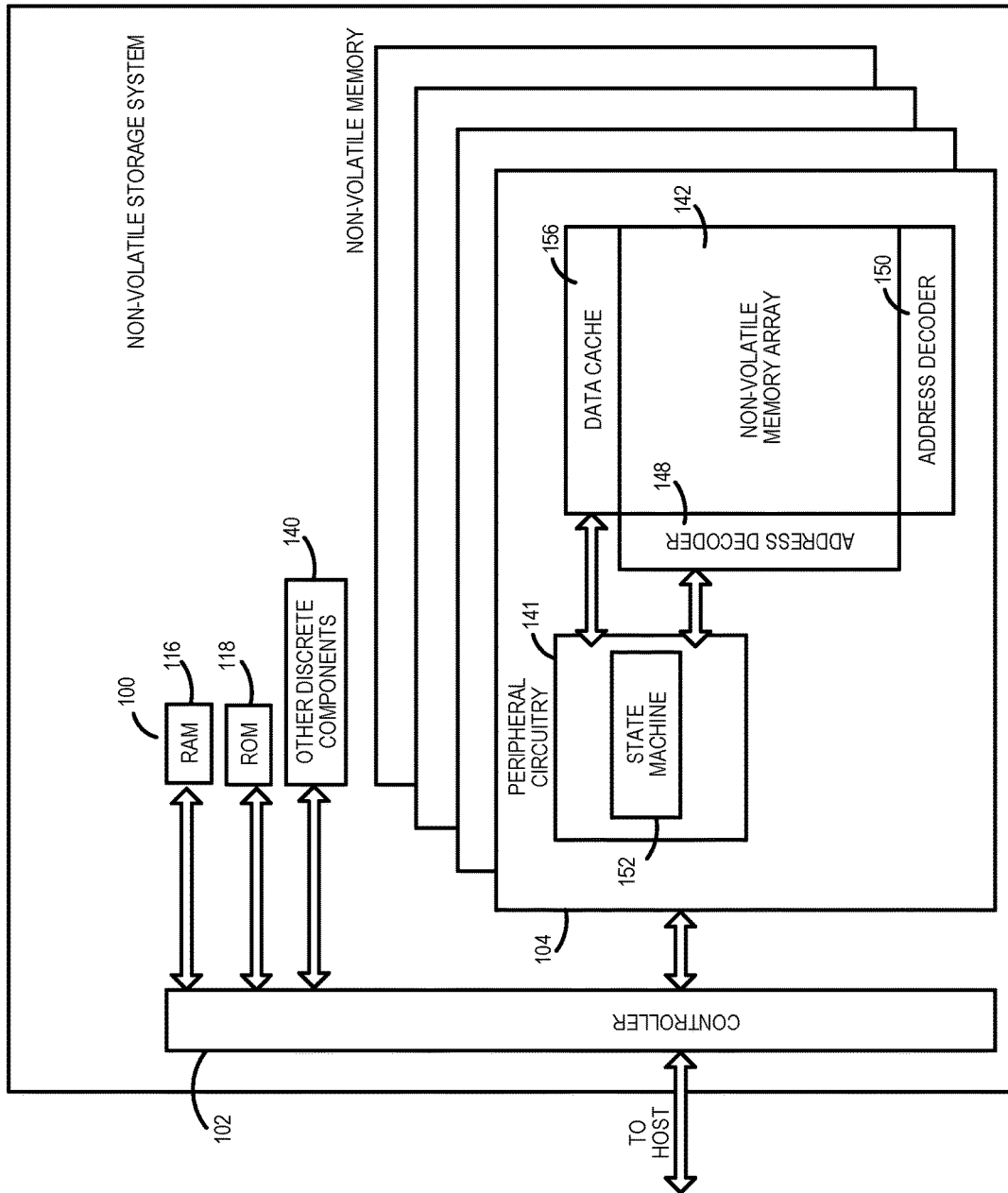
FIG. 2B is a block diagram illustrating components of the memory data storage device illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two-dimensional and/or three-dimensional configuration. Non-volatile memory die 104 further includes a data cache 156 that caches data and row and address decoders 148, 150. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may be written in only multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
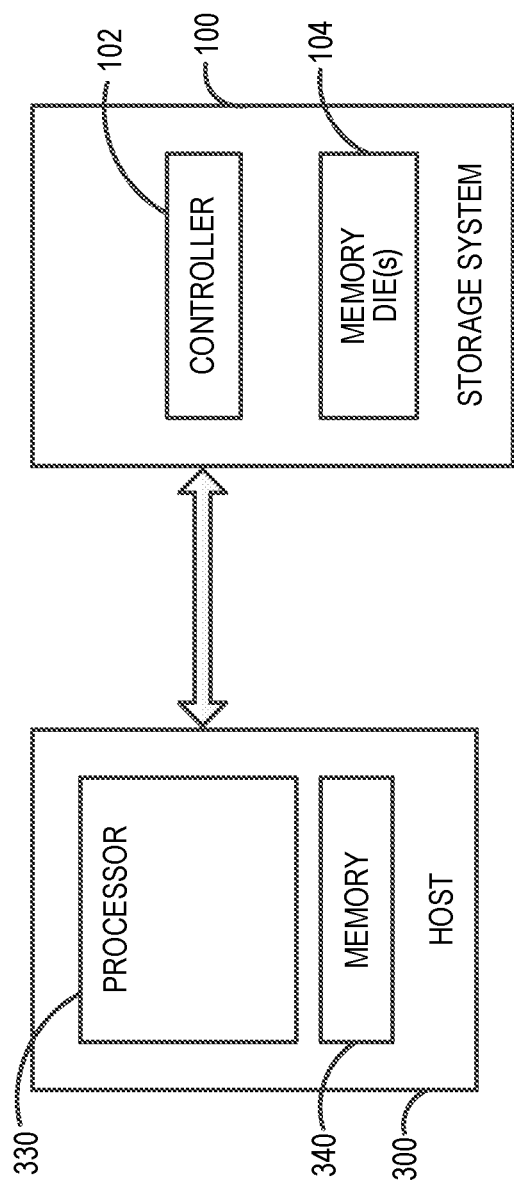
FIG. 3 is a block diagram of a host and data storage device of an embodiment.

Turning again to the drawings, FIG. 3 is a block diagram of a host 300 and data storage device 100 of an embodiment. The host 300 can take any suitable form, including, but not limited to, a computer, a mobile phone, a tablet, a wearable device, a digital video recorder, a surveillance system, etc. The host 300 in this embodiment (here, a computing device) comprises a processor 330 and a memory 340. In one embodiment, computer-readable program code stored in the host memory 340 configures the host processor 330 to perform the acts described herein. So, actions performed by the host 300 are sometimes referred to herein as being performed by an application (computer-readable program code) run on the host 300. For example, the host 300 can be configured to send data (e.g., initially stored in the host's memory 340) to the data storage device 100 for storage in the data storage device's memory 104.

As mentioned above, some data storage devices select blocks of memory from a free block pool list and randomly allocate the blocks as primary and secondary blocks to redundantly store data in a write operation. After the data is redundantly written, the data storage device can check to see if the data was successfully written to the primary block. If the data was successfully written to the primary block, the secondary block can be repurposed. However, if the data was not successfully written to the primary block, the data may still be available in the secondary block if successfully written therein.

Figure 4:
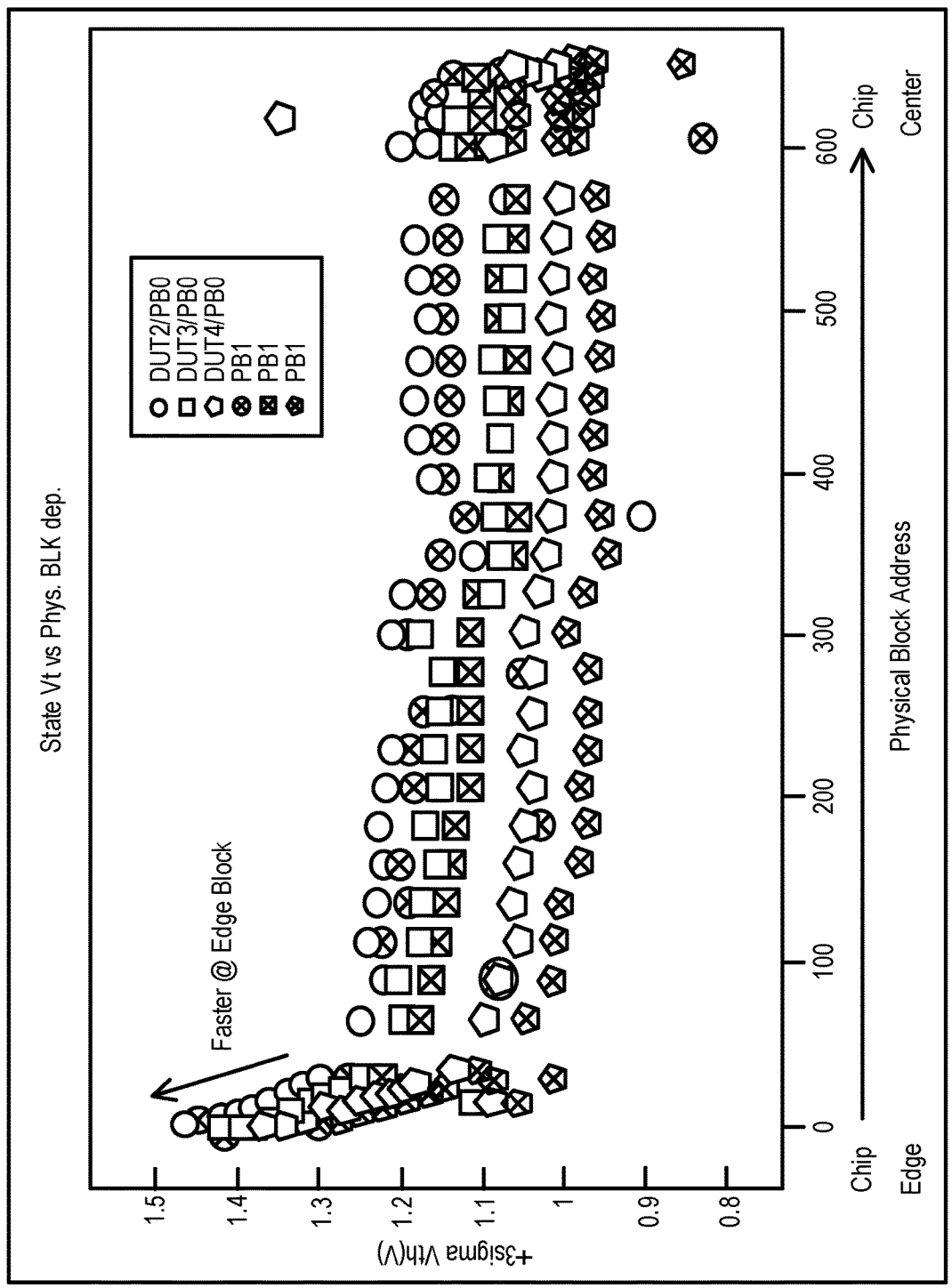
FIG. 4 is a graph of an embodiment of state voltage threshold versus physical block address.
Figure 5:
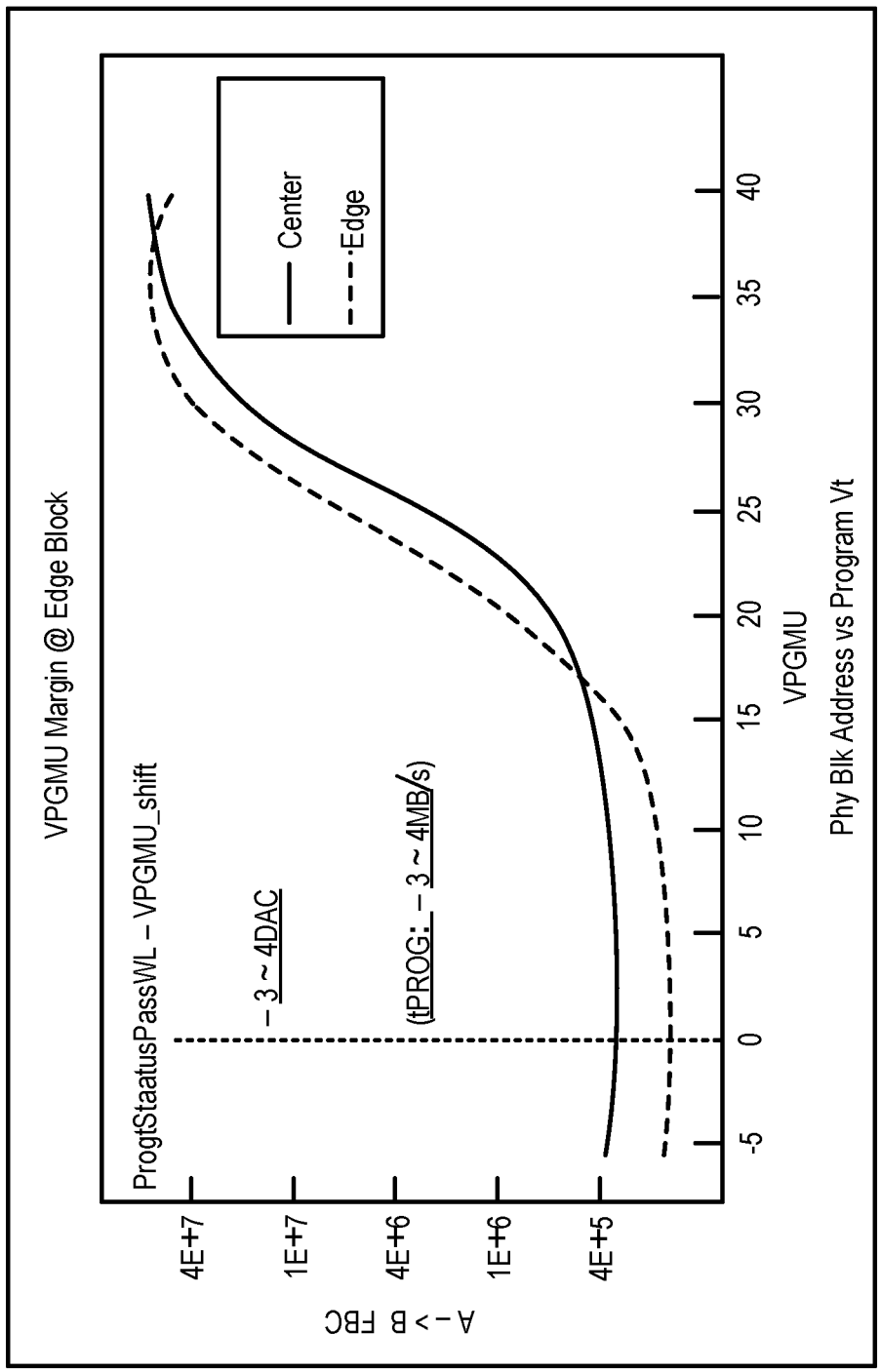
FIG. 5 is a graph of an embodiment of physical block location versus program voltage margin.

The following embodiments recognize that not all blocks in the free block pool are the same and may present various challenges if used as a primary block. For example, in a bit column stacked (BiCS) 8×4 die, there may be challenges with the memory blocks on the edge of the plane ("plane edge blocks") due to systematic process-related deterioration factors (e.g., SiO2 slimming and/or channel slimming). More specifically, due to process variations, plane edge blocks can have a strong programming for a given program voltage (Vpgm). In other words, using the same starting Vpgm for all blocks can result in edge blocks being programmed to a higher voltage threshold (Vt) (see FIG. 4) and having a worsened Vpgm margin/read disturb (e.g., a Vpgm margin loss of 3~4DAC, RD 100 mV worse, as shown in FIG. 5). In other words, edge blocks in every plane can see A-State over-programming.

One way to solve this problem from the memory-side is to use set features and shift the verify-read voltage supplied to a selected word line during the verify-read operation (VCGRV) upward on a selected zone for plane edge blocks to compensate for the Vpgm margin in order not to have read disturb. However, adding this set feature takes time and, thus, impacts performance as it leads to more programming/sense time, which occurs in the foreground in the performance path. That is, if set feature is introduced to cover Vpgm margin loss, additional timing may need to be budgeted for programming.

Figure 6:
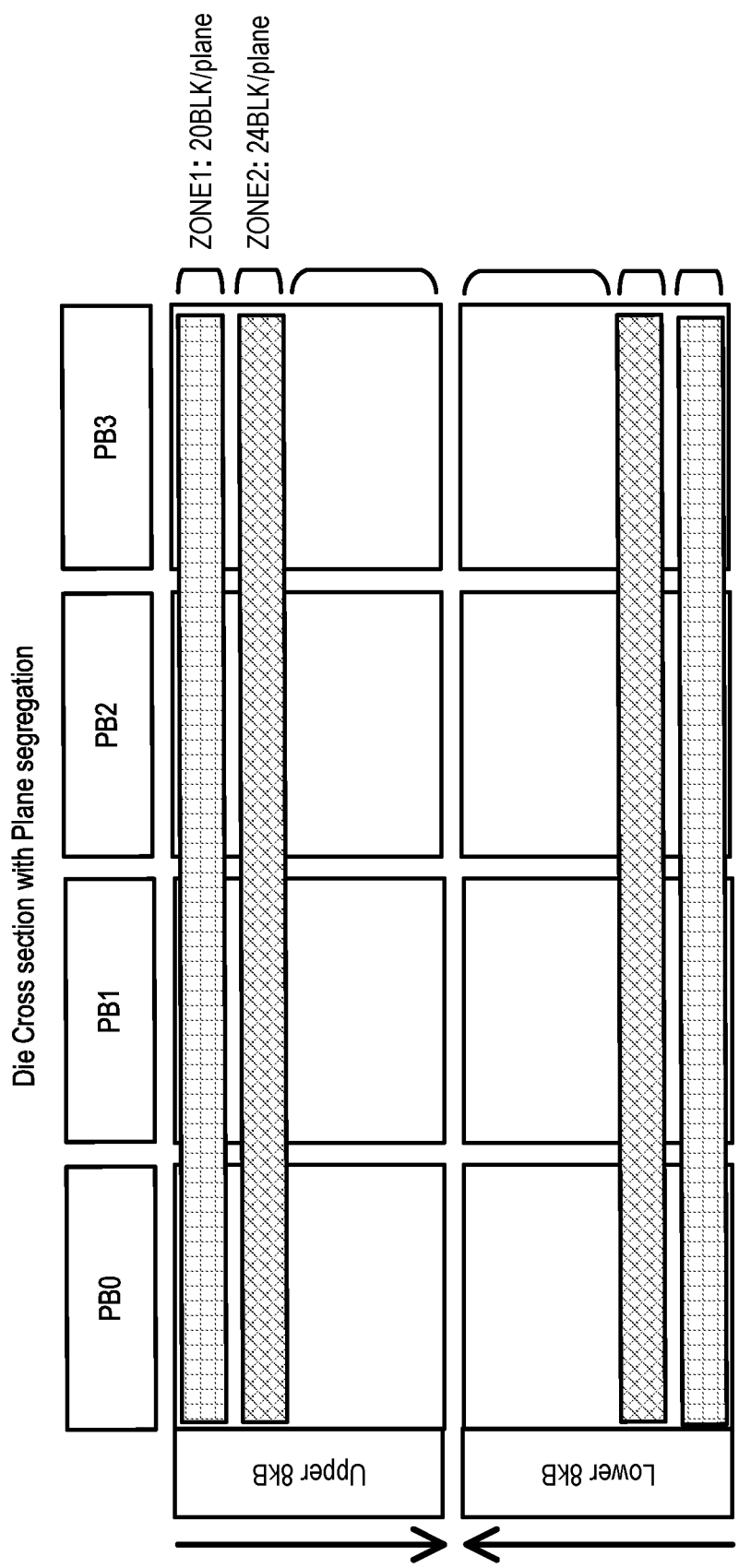
FIG. 6 is an illustration of a die cross section with plane segregation of an embodiment.

The following embodiments provide a different solution to the problem by allocating plane edge blocks as secondary blocks in a redundant write operation because secondary blocks are typically not as read-intensive as primary blocks and are typically kept open for a shorter time than primary blocks. That is, allocating edge blocks as secondary blocks can avoid the Vpgm margin loss potential read disturb issues noted above for primary blocks. In the example shown in FIG. 6, blocks at the end of plane (EDGEBLK) have bad Vpgm margin/read disturb. In this example, there are 20 blocks per plane in Zone 1 and 24 blocks per plane in Zone 2. In total, there are 176 blocks that can be used as secondary blocks in this example.

Figure 7:
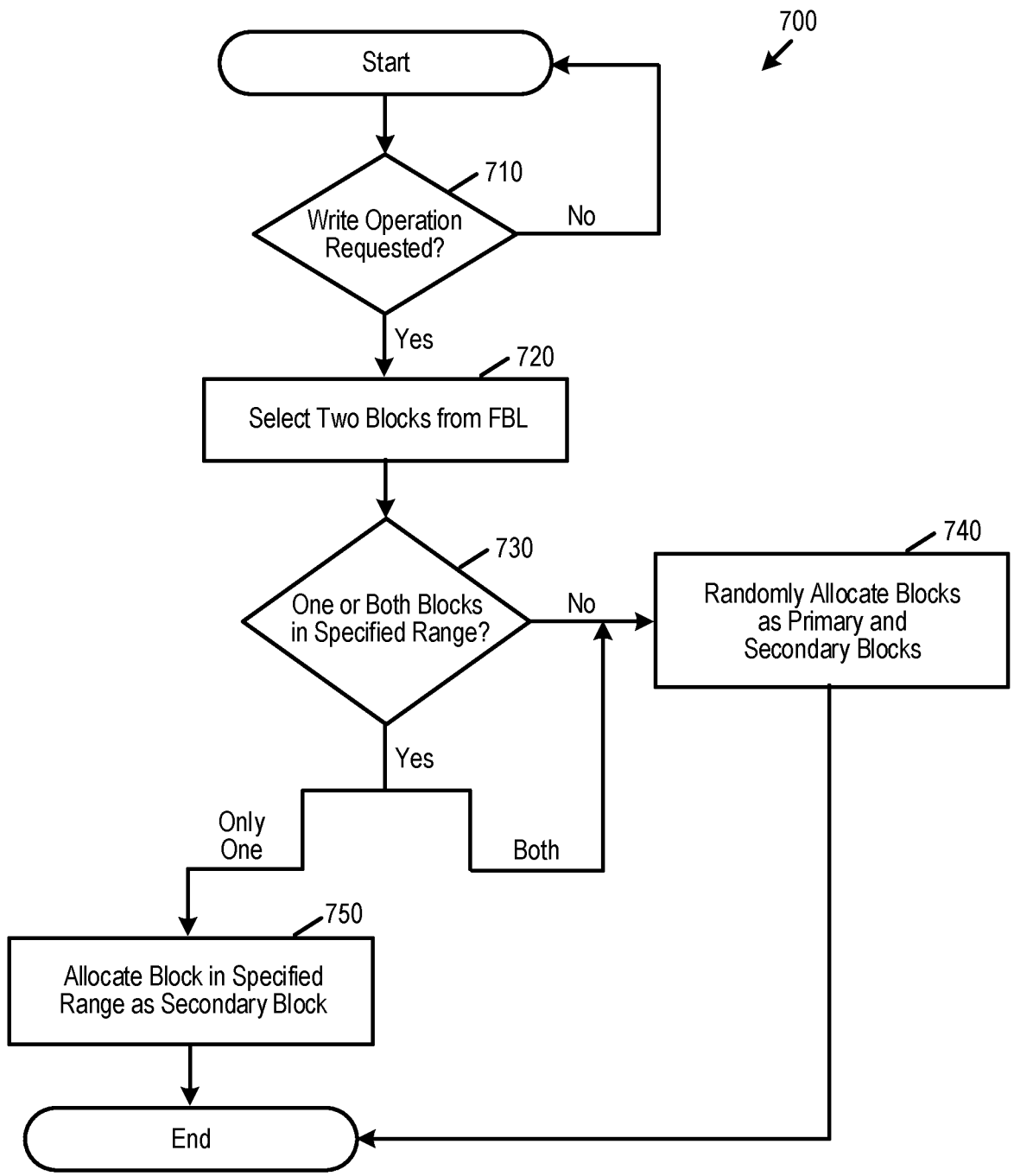
FIG. 7 is a flow chart of a method of an embodiment for intelligent block allocation.

FIG. 7 is a flow chart 700 of a method of an embodiment for intelligent block allocation. As shown in FIG. 7, the controller 102 of the data storage device 100 determines if a write operation is requested (act 710). If a write operation is requested, the controller 102 then picks two blocks from a free block list for use as primary and secondary blocks for a redundant write operation (act 720). Next, the controller 102 determines if one or more of the chosen blocks have block numbers that are in a specified range of block numbers (act 730). The specified range can be represented in any suitable way (e.g., 95C to 9A0 in hexadecimal) and can be the range of plane edge blocks that would encounter the challenges noted above.

If neither of the chosen blocks are in the specified range (e.g., neither of the chosen blocks is a plane edge block) or if both of the chosen blocks are in the specified range (e.g., both of the chosen blocks are plane edge blocks), the controller 102 can randomly allocate the chosen blocks as primary and secondary blocks (act 740). However, if only one of the chosen blocks is in the specified range (e.g., only one of the chosen blocks is a plane edge block), the controller 102 can allocate the block that is in the specified range as the secondary block (act 750).

After the primary and secondary blocks have been allocated, the controller 102 writes data in both the primary and secondary blocks for redundancy in order to protect the data. That way, if the primary block fails, the secondary block can be used as a backup. Then, the controller 102 can perform a post-write read operation on the primary block. If the post-write read operation on the primary block is successful, the controller 102 can release the secondary block to the free block list (FBL) pool, as that block is not needed for backup. Also, because the primary block is not a plane edge block, it should meet full reliability and data retention (DR) and read disturb (RD) specifications. However, if the post-write read operation on the primary block is not successful, the controller 102 can attempt to recover the data by performing a voltage shift operation. If that is not successful, the controller 102 can perform a garbage collection operation on the secondary block to move data from the secondary block to another block. Since the data is stored in the secondary block for a relatively-short amount of time and does not undergo multiple reads unless the primary block fails, the secondary block does not need to have a relatively-tight read disturb (RD) specification.

There are several advantages associated with these embodiments. For example, these embodiments can be used to solve the problems discussed above with a robust system solution without much impact on performance. Further, these embodiments can satisfy read disturb specifications without compromise.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three-dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. In a data storage device comprising a memory, a method comprising performing as part of a write operation:
   identifying block numbers of blocks chosen for use as primary and secondary blocks for the write operation;
   determining whether one or both of the blocks are in a specified range of block numbers; and
   in response to determining that only one of the blocks is in the specified range of block numbers;
      allocating that block as the secondary block and allocating the other block as the primary block;
      performing a write operation in which data is written in both the primary block and secondary block, wherein the data written in the secondary block is redundant to the data written in the primary block, wherein the secondary block has a lower program voltage margin than the primary block, and wherein the data is written in the secondary block without shifting a verify-read voltage upward to attempt to compensate for the lower program voltage margin in the secondary block;
      performing a post-write read operation on the data written in the primary block; and
      in response to a failure of the post-write read operation on the data written in the primary block:
         attempting to read the data written in the secondary block by performing a voltage shift to attempt to compensate for the lower program voltage margin;
         performing a garbage collection operation on the secondary block to move the data written in the secondary block to another block; and
         releasing the secondary block to a free block pool.

2. The method of claim 1, wherein the plane edge blocks comprise a plurality of zones, wherein at least two of the plurality of zones comprise different numbers of plane edge blocks.

3. The method of claim 1, wherein the blocks are chosen from the free block pool.

4. The method of claim 1, wherein the memory comprises a bit column stacked die.

5. The method of claim 1, wherein the memory comprises a three-dimensional memory array.

6. The method of claim 1, wherein the data is written in multi-level cell (MLC) memory in the primary and second blocks.

7. The method of claim 1, further comprising:
   in response to determining that both of the blocks are in the specified range of block numbers, randomly allocating one of the blocks as the primary block and the other block as the secondary block.

8. The method of claim 1, further comprising:
   in response to determining that neither of the blocks is in the specified range of block numbers, randomly allocating one of the blocks as the primary block and the other block as the secondary block.

9. A data storage device comprising:
   a memory; and
   a processor coupled with the memory and configured to perform as part of a write operation:
      select blocks from a free block pool for use as primary and secondary blocks for the write operation;
      determine whether one or both of the blocks are plane edge blocks;
      in response to determining that only one of the blocks is a plane edge block, allocate that block as the secondary block and allocate the other block as the primary block;
      write data in both the primary block and secondary block, wherein the data written in the secondary block is redundant to the data written in the primary block, wherein the secondary block has a lower program voltage margin than the primary block, and wherein the data is written in the secondary block without shifting a verify-read voltage upward to attempt to compensate for the lower program voltage margin in the secondary block;
      perform a post-write read operation on the data written in the primary block; and
      in response to a failure of the post-write read operation on the data written in the primary block:
         attempt to read the data written in the secondary block by performing a voltage shift to attempt to compensate for the lower program voltage margin;

perform a garbage collection operation on the secondary block to move the data written in the secondary block to another block; and release the secondary block to the free block pool.

10. The data storage device of claim 9, wherein the processor is further configured to:

in response to determining that both of the blocks are plane edge blocks, randomly allocate one of the blocks as the primary block and the other block as the secondary block.

11. The data storage device of claim 9, wherein the processor is further configured to:

in response to determining that neither of the blocks is a plane edge block, randomly allocate one of the blocks as the primary block and the other block as the secondary block.

12. The data storage device of claim 9, wherein the plane edge blocks comprise a plurality of zones, wherein at least two of the plurality of zones comprise different numbers of plane edge blocks.

13. The data storage device of claim 9, wherein the memory comprises a bit column stacked (BiCS) die.

14. The data storage device of claim 9, wherein the memory comprises a three-dimensional memory array.

15. The data storage device of claim 9, wherein the data is written in multi-level cell (MLC) memory in the primary and second blocks.

16. A data storage device comprising:

a memory comprising a primary block and a secondary block, wherein the secondary block comprises a plane edge block; and means for performing as part of a write operation:

selecting blocks from a free block pool for use as primary and secondary blocks for a write operation;

determining whether one or both of the blocks are plane edge blocks;

in response to determining that only one of the blocks is a plane edge block, allocate that block as the secondary block and allocate the other block as the primary block;

writing data in both the primary block and secondary block, wherein the data written in the secondary block is redundant to the data written in the primary block, wherein the secondary block has a lower program voltage margin than the primary block, and wherein the data is written in the secondary block without shifting a verify-read voltage upward to attempt to compensate for the lower program voltage margin in the secondary block;

performing a post-write read operation on the data written in the primary block; and in response to a failure of a post-write read operation on the data written in the primary block:

attempting to read the data written in the secondary block by performing a voltage shift to attempt to compensate for the lower program voltage margin;

performing a garbage collection operation on the secondary block to move the data written in the secondary block to another block; and releasing the secondary block to the free block pool.

* * * * *